United States Patent
Akiyoshi

(10) Patent No.: US 10,580,577 B2
(45) Date of Patent: Mar. 3, 2020

(54) MULTILAYER CERAMIC ELECTRONIC COMPONENT AND MOUNTING STRUCTURE THEREOF

(71) Applicant: Murata Manufacturing Co., Ltd., Nagaokakyo-shi, Kyoto-fu (JP)

(72) Inventor: Teppei Akiyoshi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 89 days.

(21) Appl. No.: 16/016,893

(22) Filed: Jun. 25, 2018

(65) Prior Publication Data

US 2018/0374639 A1   Dec. 27, 2018

(30) Foreign Application Priority Data

Jun. 27, 2017 (JP) .................. 2017-125647

(51) Int. Cl.
*H01G 4/232* (2006.01)
*H01G 2/06* (2006.01)
(Continued)

(52) U.S. Cl.
CPC ............ *H01G 4/232* (2013.01); *H01G 2/06* (2013.01); *H01G 4/12* (2013.01); *H01G 4/30* (2013.01); *H01G 4/0085* (2013.01); *H01G 4/2325* (2013.01); *H05K 2201/10015* (2013.01); *H05K 2201/10946* (2013.01)

(58) Field of Classification Search
CPC .......... H01G 4/228; H01G 4/232; H01G 4/30; H01G 4/12; H01G 2/02; H01G 2/06
See application file for complete search history.

(56) References Cited

U.S. PATENT DOCUMENTS 6,201,683 B1 *  3/2001  Yamada ............... H05K 3/3426
                                                361/308.1
6,288,887 B1 *  9/2001  Yoshida ................ H01G 4/232
                                                361/306.1
(Continued)

FOREIGN PATENT DOCUMENTS

JP          05-029108 U       4/1993
JP          09-205275 A       8/1997
                (Continued)

*Primary Examiner* — Eric W Thomas
(74) *Attorney, Agent, or Firm* — Keating & Bennett, LLP

(57) ABSTRACT

A multilayer ceramic electronic component includes a first metal terminal including a first terminal joining portion connected to a first end surface, a first extending portion connected to the first terminal joining portion and extending toward a mounting surface, and a first mounting portion connected to the first extending portion and extending in a length direction connecting the first end surface and a second end surface; a second metal terminal including a second terminal joining portion connected to the second end surface, a second extending portion extending from the second terminal joining portion toward the mounting surface, and a second mounting portion connected to the second extending portion and extending in a length direction connecting the first end surface and the second end surface. The first and second mounting portions include protrusions protruding toward the mounting surface.

19 Claims, 7 Drawing Sheets

(51) Int. Cl.
  *H01G 4/30* (2006.01)
  *H01G 4/12* (2006.01)
  H01G 4/008 (2006.01)

(56) References Cited

U.S. PATENT DOCUMENTS

| | | | | |
|---|---|---|---|---|
| 6,518,632 | B1 * | 2/2003 | Yoshida | H01G 4/228 |
| | | | | 257/393 |
| 6,940,708 | B2 * | 9/2005 | Yoshii | H01G 2/065 |
| | | | | 361/303 |
| 10,056,320 | B2 * | 8/2018 | Murrell | H01G 4/232 |
| 2008/0174931 | A1 * | 7/2008 | Skamser | H01G 2/065 |
| | | | | 361/272 |
| 2015/0187495 | A1 * | 7/2015 | Maeda | H01G 4/30 |
| | | | | 361/303 |
| 2017/0236643 | A1 * | 8/2017 | Peuser | H05K 1/0203 |
| | | | | 257/762 |
| 2017/0316878 | A1 * | 11/2017 | Peuser | H01G 4/30 |
| 2018/0075973 | A1 * | 3/2018 | Ando | H01G 4/224 |
| 2018/0294100 | A1 * | 10/2018 | Ando | H01G 4/248 |

FOREIGN PATENT DOCUMENTS

| | | | |
|---|---|---|---|
| JP | 11-191472 | A | 7/1999 |
| JP | 2001-189232 | A | 7/2001 |
| JP | 2001189232 | A * | 7/2001 |

* cited by examiner

III-III cross-sectional view

V-V cross-sectional view

MULTILAYER CERAMIC ELECTRONIC COMPONENT AND MOUNTING STRUCTURE THEREOF

CROSS REFERENCE TO RELATED APPLICATIONS

This application claims the benefit of priority to Japanese Patent Application No. 2017-125647 filed on Jun. 27, 2017. The entire contents of this application are hereby incorporated herein by reference.

BACKGROUND OF THE INVENTION

1. Field of the Invention

The present invention relates to a multilayer ceramic electronic component including, for example, a multilayer ceramic capacitor and a mounting structure thereof.

2. Description of the Related Art

In recent years, multilayer ceramic capacitors, which are chip type electronic components made of ceramics, are typically used. In the case in which the multilayer ceramic capacitor is directly solder-mounted to a mounting substrate, the mounting substrate and an electronic component body expand or contract based on the respective thermal expansion coefficients when a temperature change occurs. However, a difference between the thermal expansion coefficients of the two causes stress which causes, for example, damage to the electronic component body or destruction of a joint portion.

When the mounting substrate is easily bent, such as a thin glass epoxy substrate, the same stress is generated when the mounting substrate is bent.

Further, the same stress is generated by bending and deforming the substrate when a force is applied to the mounting substrate itself.

When these stresses are applied to the multilayer ceramic capacitor, cracks may occur in the multilayer ceramic capacitor. In order to solve this problem, it is suggested to solder a metal terminal to a mounting substrate while attaching a metal terminal made of a metal plate to an external electrode of a multilayer ceramic capacitor and keeping an electronic component body floating from the mounting substrate (See Japanese Patent Application Laid-Open No. 2001-189232).

According to such a method, heat at the time of soldering is transmitted to the electronic component body through the metal terminal, so that thermal shock is less likely to be applied to the electronic component body. Even if stress caused by temperature change or deformation of the mounting substrate occurs, the electronic component body is able to advantageously absorb the stress and deformation by elastic deformation of the metal terminal.

In addition to soldering, welding (for example, laser welding as a construction method capable of shortening welding time) is a known method for mounting a connection terminal at a mounting point (see Japanese Patent Application Laid-Open No. H11-191472). However, in the case of mounting an electronic component with a metal terminal as described in Japanese Patent Application Laid-Open No. 2001-189232 on a mounting substrate by soldering to a device (vehicle-mounted device) used in a high-temperature environment, a component detaches or falls from the mounting substrate due to melting of solder joining the metal terminal and the mounting substrate, or if the solder is exposed to a high temperature for a long period of time at a temperature at which the solder does not melt, the solder is weakened, so that problems may occur, such as an increase in equivalent series resistance (ESR) and a decrease in fixing strength due to formation of solder cracks. To avoid this, it is generally conceivable to use a solder having a higher melting point. However, there is no satisfactory solder at present due to price, mountability, and performance to solve the problems described above.

In a known welding and mounting technique as disclosed in Japanese Patent Application Laid-Open No. H11-191472, it is necessary to melt and connect the metal by holding down the metal to be connected against a portion to be welded and energizing the metal with reliable surface contact. If this technique is applied to an electronic component with a metal terminal as disclosed in Japanese Patent Application Laid-Open No. 2001-189232, it is necessary to securely bring a connection terminal member of the metal terminal to be mounted into surface contact with a mounting surface of a mounting substrate, and thus there is a problem in that it takes time to make the connection.

Also in the case of laser welding as disclosed in Japanese Patent Application Laid-Open No. H11-191472, when this technique is applied to the electronic component with a metal terminal as disclosed in Japanese Patent Application Laid-Open No. 2001-189232, it is an essential condition that the connection terminal member of the metal terminal to be mounted is securely in surface contact with the mounting surface of the mounting substrate. At this time, it is difficult to achieve a situation in which a portion to be welded is securely in contact due to problems of warpage of the mounting substrate and coplanarity of the electronic component (flatness of components (in the case of metal terminals, deviation of mounting surfaces of right and left metal terminals)), and this may result in poor welding.

In addition, there is a problem that since the metallic terminal having metallic luster reflects laser energy, efficient welding cannot be performed.

Although a method of conducting laser welding while holding down electronic components by another method is conceivable, it becomes impossible to make full use of the speed of laser welding obtained without contact.

SUMMARY OF THE INVENTION

Preferred embodiments of the present invention provide multilayer ceramic electronic components each including a metal terminal which is able to be reliably welded and mounted even if a mounting substrate warps, a connection portion is not disposed in a single plane due to a step difference, or coplanarity on the electronic component side is low, and also provide mounting structures thereof.

A multilayer ceramic electronic component according to a preferred embodiment of the present invention includes a laminate including a plurality of ceramic layers and a plurality of internal electrode layers, which are alternately stacked, a first main surface and a second main surface facing each other in a stacking direction, a first side surface and a second side surface facing each other in a width direction orthogonal or substantially orthogonal to the stacking direction, and a first end surface and a second end surface facing each other in a length direction orthogonal or substantially orthogonal to the stacking direction and the width direction, an electronic component body including a first external electrode connected to the first end surface of the laminate and a second external electrode connected to the second end surface of the laminate, a first metal terminal connected to the first external electrode, and a second metal terminal connected to the second external electrode. In the multilayer ceramic electronic component, the second main surface of the laminate is located on a side of a mounting surface of a mounting substrate on which the multilayer ceramic electronic component is to be mounted, the first metal terminal includes a first terminal joining portion connected to the first end surface, a first extending portion which is connected to the first terminal joining portion and extends in a direction of the mounting surface such that a gap is provided between the second main surface of the electronic component body and the mounting surface of the mounting substrate, and a first mounting portion which is connected to the first extending portion and extends to the side opposite to the electronic component body side, the second metal terminal includes a second terminal joining portion connected to the second end surface, a second extending portion which is connected to the second terminal joining portion and extends in the direction of the mounting surface such that a gap is provided between the second main surface of the electronic component body and the mounting surface of the mounting substrate, and a second mounting portion which is connected to the second extending portion and extends to the side opposite to the electronic component body side, the first mounting portion includes a first protrusion and a second protrusion protruding toward the mounting surface on both end sides located in a direction connecting the first and second side surfaces of the first mounting portion, the second mounting portion includes a third protrusion protruding toward the mounting surface, and apexes of the first, second, and third protrusions are in contact with the mounting surface.

In a multilayer ceramic electronic component according to a preferred embodiment of the present invention, a height of the first and second protrusions from the mounting surface side of the first mounting portion is preferably not less than about 0.1 mm and not more than about 0.5 mm.

Further, in a multilayer ceramic electronic component according to a preferred embodiment of the present invention, the height of the first and second protrusions from the mounting surface side of the first mounting portion is preferably not less than about 3% and not more than about 17% of an interval between the first protrusion and the second protrusion.

Further, in a multilayer ceramic electronic component according to a preferred embodiment of the present invention, it is preferable that the first and second mounting portions be bent to the side opposite to the electronic component body.

Furthermore, in a multilayer ceramic electronic component according to a preferred embodiment of the present invention, it is preferable that surfaces of the first and second metal terminals be subjected to black painting or oxidation treatment.

A mounting structure of a multilayer ceramic electronic component according to a preferred embodiment of the present invention is described below, and the multilayer ceramic electronic component includes a laminate including a plurality of ceramic layers and a plurality of internal electrode layers, which are stacked alternately, a first main surface and a second main surface facing each other in a stacking direction, a first side surface and a second side surface facing each other in a width direction orthogonal or substantially orthogonal to the stacking direction, and a first end surface and a second end surface facing each other in a length direction orthogonal or substantially orthogonal to the stacking direction and the width direction, an electronic component body including a first external electrode connected to the first end surface of the laminate and a second external electrode connected to the second end surface of the laminate, a first metal terminal connected to the first external electrode, and a second metal terminal connected to the second external electrode. In the mounting structure, the second main surface of the laminate is located on a side of a mounting surface of a mounting substrate on which the multilayer ceramic electronic component is to be mounted, the first metal terminal includes a first terminal joining portion connected to the first end surface, a first extending portion which is connected to the first terminal joining portion and extends toward the mounting surface such that a gap is provided between the second main surface of the electronic component body and the mounting surface of the mounting substrate, and a first mounting portion which is connected to the first extending portion and extends to the side opposite to the electronic component body side, the second metal terminal includes a second terminal joining portion connected to the second end surface, a second extending portion which is connected to the second terminal joining portion and extends in the direction of the mounting surface such that a gap is provided between the second main surface of the electronic component body and the mounting surface of the mounting substrate, and a second mounting portion which is connected to the second extending portion and extends to the side opposite to the electronic component body side, a first protrusion and a second protrusion protruding toward the mounting surface are disposed on both end sides located in a direction connecting the first and second side surfaces of the first mounting portion, the second mounting portion includes a third protrusion protruding toward the mounting surface, and the respective apexes of the first, second, and third protrusions are joined to the mounting surface of the mounting substrate. Further, in the mounting structure, the multilayer ceramic electronic component is joined to the mounting surface of the mounting substrate by welding from a first recess on the opposite side to the mounting surface of the mounting substrate at the position of the first protrusion, joined to the mounting surface of the mounting substrate by welding from a second recess on the opposite side to the mounting surface of the mounting substrate at the position of the second protrusion, and joined to the mounting surface of the mounting substrate by welding from a third recess on the opposite side to the mounting surface of the mounting substrate at the position of the third protrusion.

Further, in a mounting structure of a multilayer ceramic electronic component according to a preferred embodiment of the present invention, during the joining by welding, it is preferable that the first, second, and third recesses be irradiated with a laser, so that the multilayer ceramic electronic component is joined by laser welding.

According to preferred embodiments of the present invention, it is possible to obtain multilayer ceramic electronic components each including a metal terminal which is able to be reliably welded and mounted even if a mounting substrate warps, a connection portion is not disposed in a single plane due to a step difference, or coplanarity on the electronic component side is low, and mounting structures thereof.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6A and 6B are external perspective views showing a metal terminal included in a multilayer ceramic electronic component according to a preferred embodiment of the present invention, wherein FIG. 6A is a first metal terminal and FIG. 6B is a second metal terminal.

DETAILED DESCRIPTION OF THE PREFERRED EMBODIMENTS

Figure 1:
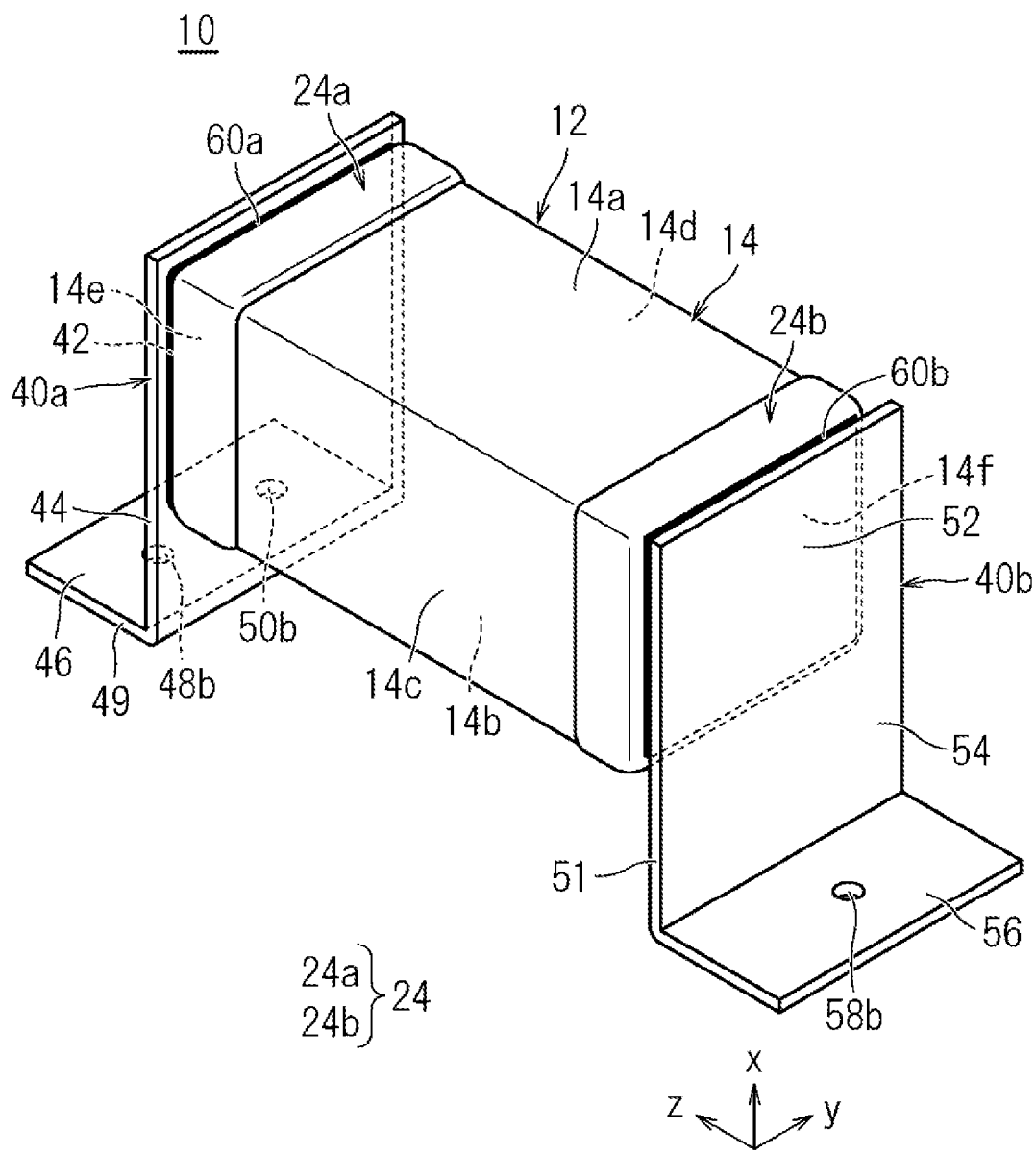
FIG. 1 is an external perspective view showing an example of a multilayer ceramic electronic component according to a preferred embodiment of the present invention.
Figure 2:
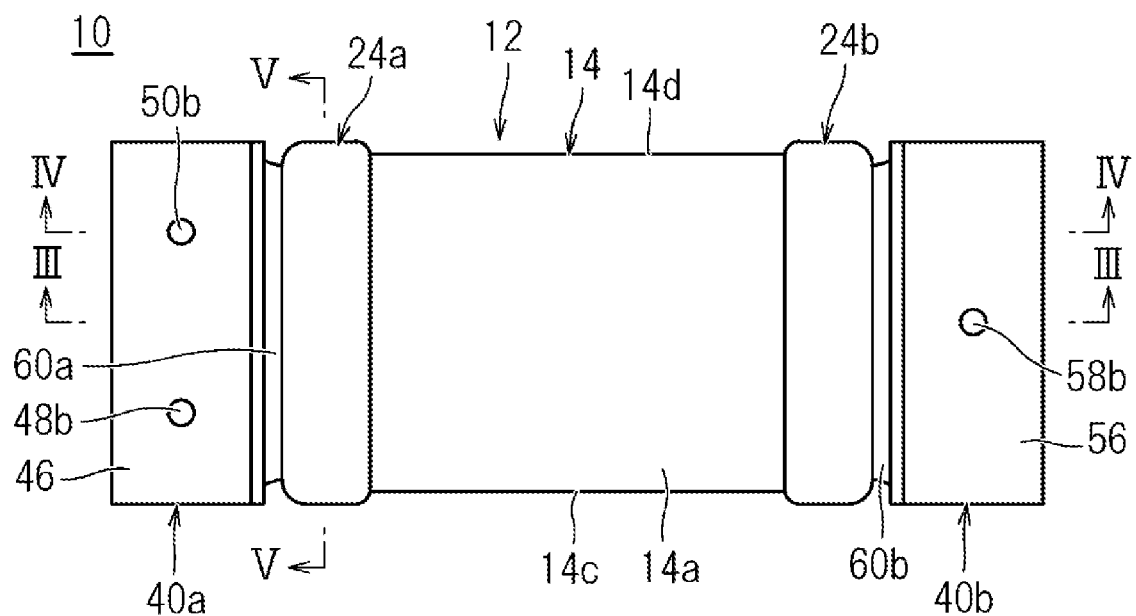
FIG. 2 is a plan view of FIG. 1 showing a multilayer ceramic electronic component according to a preferred embodiment of the present invention.
Figure 3:
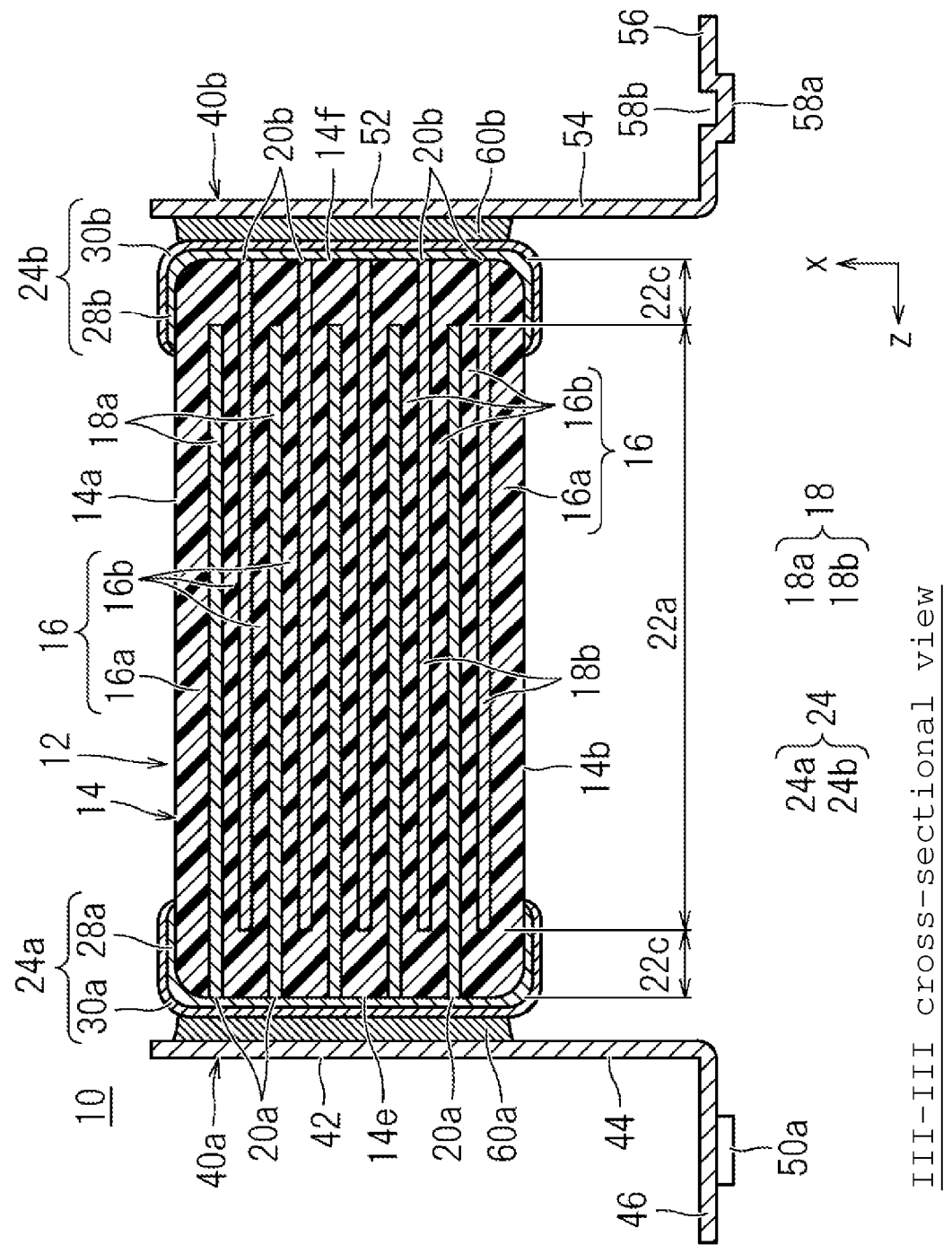
FIG. 3 is a cross-sectional view taken along line III-III of FIG. 2 showing a multilayer ceramic electronic component according to a preferred embodiment of the present invention.
Figure 4:
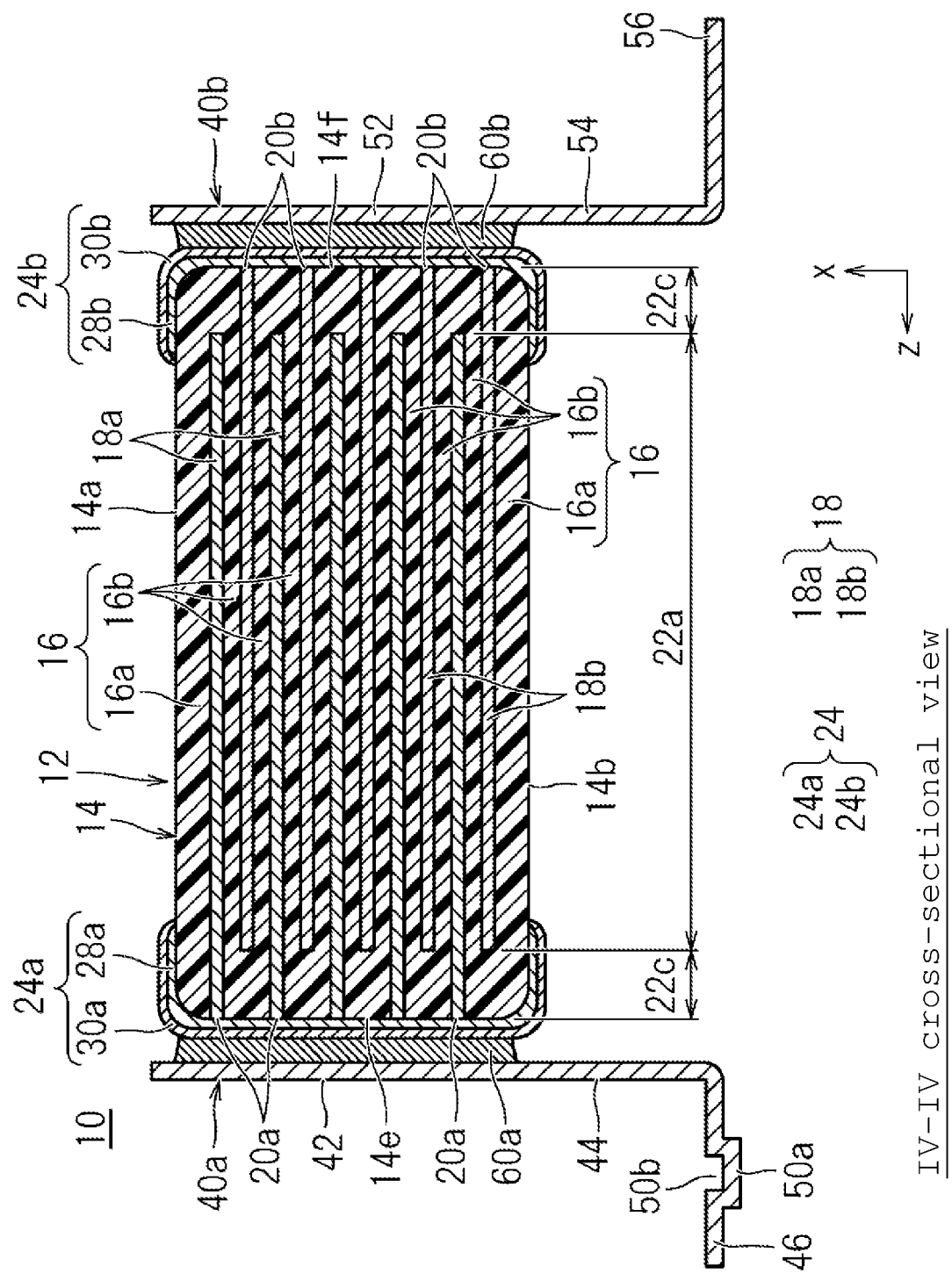
FIG. 4 is a cross-sectional view taken along line IV-IV of FIG. 2 showing a multilayer ceramic electronic component according to a preferred embodiment of the present invention.
Figure 5:
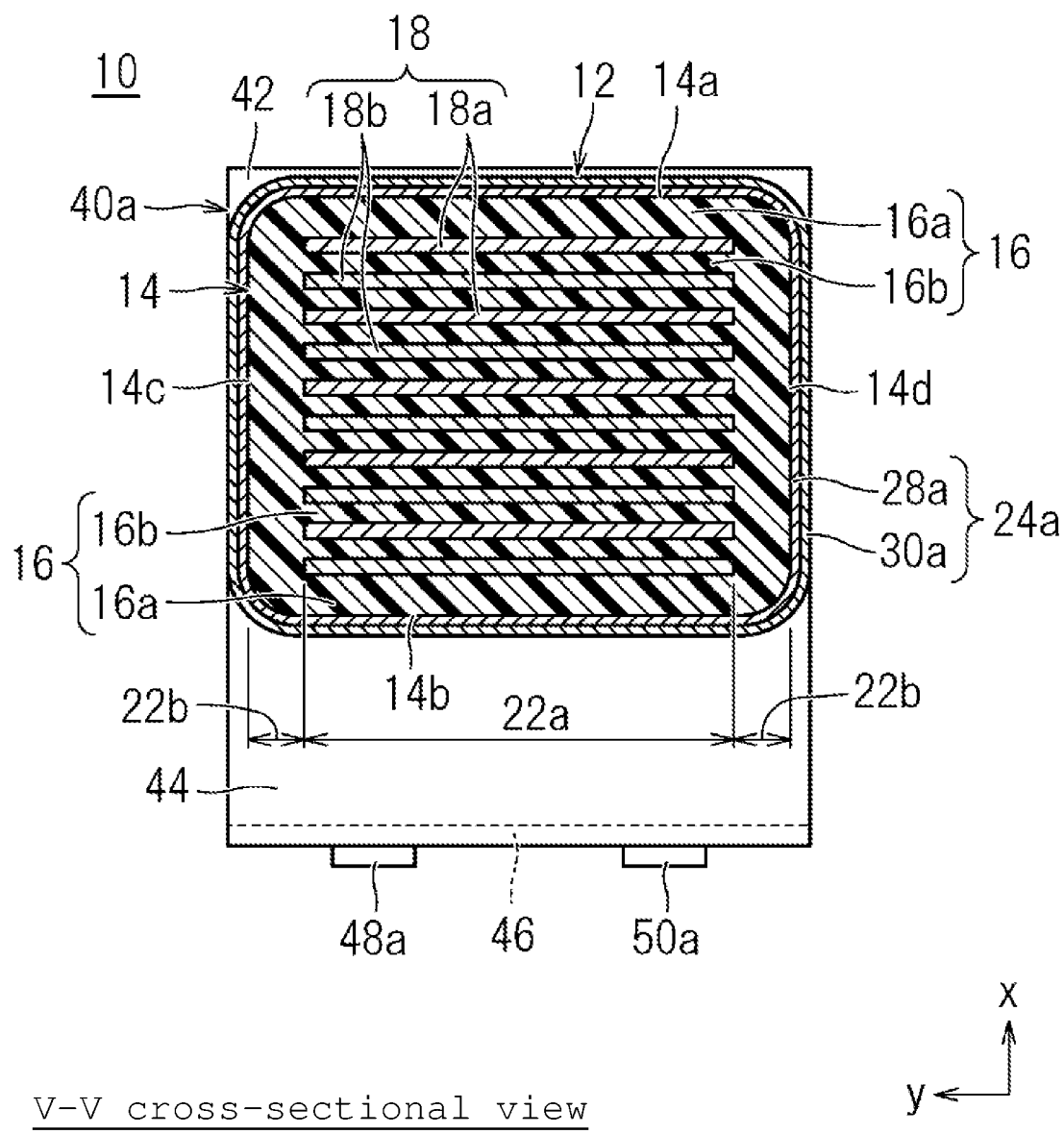
FIG. 5 is a cross-sectional view taken along line V-V of FIG. 2 showing a multilayer ceramic electronic component according to a preferred embodiment of the present invention.

Multilayer ceramic electronic components according to preferred embodiments of the present invention will be described with reference to the drawings. FIG. 1 is an external perspective view showing an example of a multilayer ceramic electronic component according to a preferred embodiment of the present invention. FIG. 2 is a plan view of FIG. 1 showing a multilayer ceramic electronic component according to a preferred embodiment of the present invention. FIG. 3 is a cross-sectional view taken along line III-III of FIG. 2 showing a multilayer ceramic electronic component according to a preferred embodiment of the present invention, and FIG. 4 is a cross-sectional view taken along line IV-IV of FIG. 2 showing a multilayer ceramic electronic component according to a preferred embodiment of the present invention. FIG. 5 is a cross-sectional view taken along line V-V of FIG. 2 showing a multilayer ceramic electronic component according to a preferred embodiment of the present invention.

Figure 6A:
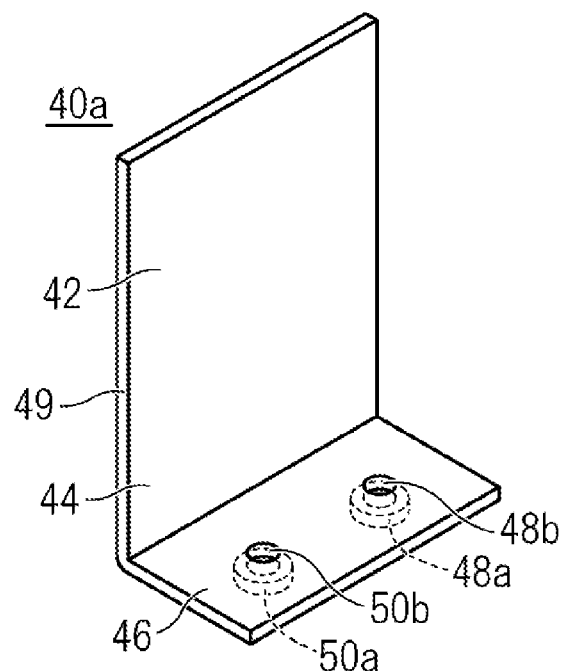
Figure 6B:
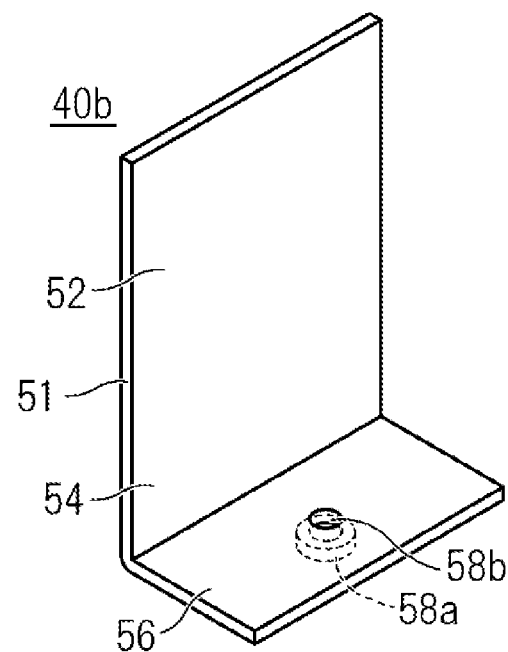
Figure 7:
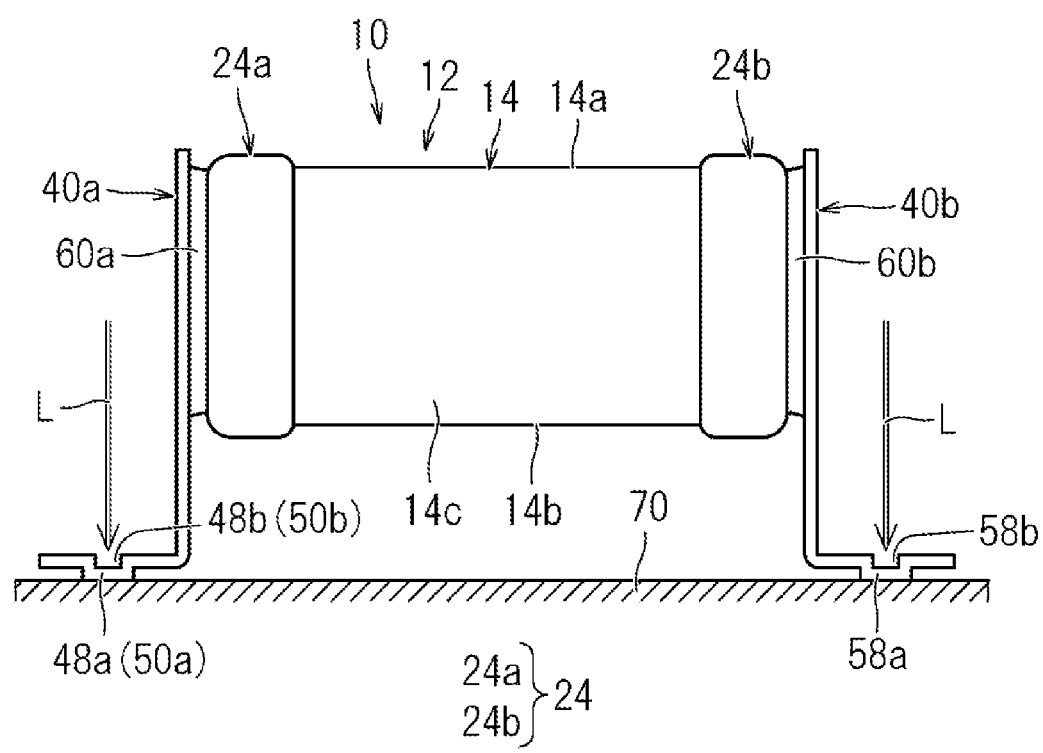
FIG. 7 is a schematic configuration diagram showing a state of a mounting structure of a multilayer ceramic electronic component according to a preferred embodiment of the present invention.

FIGS. 6A and 6B are external perspective views showing a metal terminal included in a multilayer ceramic electronic component according to a preferred embodiment of the present invention, in which FIG. 6A is a first metal terminal and FIG. 6B is a second metal terminal. FIG. 7 is a schematic configuration diagram showing a state of a mounting structure of a multilayer ceramic electronic component according to a preferred embodiment of the present invention.

As shown in FIGS. 1 to 5, a multilayer ceramic electronic component 10 includes, for example, an electronic component body 12 and first and second metal terminals 40a and 40b defined by two metal terminals. The electronic component body 12 and the first metal terminal 40a are connected via a first joining material 60a. The electronic component body 12 and the second metal terminal 40b are connected via a second joining material 60b.

The electronic component body 12 includes a rectangular or substantially parallel parallelepiped laminate 14.

The laminate 14 includes a plurality of stacked ceramic layers 16 and a plurality of stacked internal electrode layers 18. The laminate 14 further includes a first main surface 14a and a second main surface 14b facing each other in a stacking direction x, a first side surface 14c and a second side surface 14d facing each other in a width direction y orthogonal or substantially orthogonal to the stacking direction x, and a first end surface 14e and a second end surface 14f facing each other in a length direction z orthogonal or substantially orthogonal to the stacking direction x and the width direction y. It is preferable that the laminate 14 include rounded corner portions and ridge line portions. The corner portions are portions at which three adjacent surfaces of the laminate intersect, and the ridge line portions are portions at which two adjacent surfaces of the laminate intersect.

In addition, unevenness or other irregularities may be provided on a portion or on an entirety of the first main surface 14a and the second main surface 14b, the first side surface 14c and the second side surface 14d, and the first end surface 14e and the second end surface 14f.

The second main surface 14b of the laminate 14 is located on the mounting surface side of the mounting substrate on which the multilayer ceramic electronic component 10 is to be mounted.

The ceramic layer 16 includes an outer layer portion 16a including a plurality of the ceramic layers 16 and an inner layer portion 16b including a single or a plurality of the ceramic layers 16. The outer layer portions 16a are located on the first main surface 14a side and the second main surface 14b side of the laminate 14 and each of the outer layer portions 16a is the ceramic layer 16 located between the first main surface 14a and the internal electrode layer 18 closest to the first main surface 14a and the ceramic layer 16 located between the second main surface 14b and the internal electrode layer 18 closest to the second main surface 14b. A region sandwiched between both outer layer portions 16a is the inner layer portion 16b.

The ceramic layer 16 may preferably be made of, for example, a dielectric material. As the dielectric material, for example, a dielectric ceramic including a component such as $BaTiO_3$, $CaTiO_3$, $SrTiO_3$, or $CaZrO_3$ may be used. When the dielectric ceramic includes the dielectric material as a main component, depending on the properties of the desired electronic component body 12, the dielectric ceramic may include a component whose content is smaller than that of the main component, and examples of the component include an Mn compound, an Fe compound, a Cr compound, a Co compound, and an Ni compound.

When a piezoelectric ceramic is used for the laminate 14, the electronic component body defines and functions as a ceramic piezoelectric element. Specific examples of piezoelectric ceramic materials include PZT (lead titanate zirconate) based ceramic materials.

When a semiconductor ceramic is used for the laminate 14, the electronic component body defines and functions as a thermistor element. Specific examples of semiconductor ceramic materials include spinel-based ceramic materials.

When a magnetic ceramic is used for the laminate 14, the electronic component body defines and functions as an inductor element. When the electronic component body defines and functions as the inductor element, the internal electrode layer 18 is a coiled conductor. Specific examples of magnetic ceramic materials include ferrite ceramic materials.

The thickness of the fired ceramic layer 16 is preferably not less than about 0.5 μm and not more than about 80 μm, for example.

As shown in FIGS. 2 to 5, the laminate 14 includes, for example, a plurality of rectangular or substantially rectangular first internal electrode layers 18a and a plurality of rectangular or substantially rectangular second internal electrode layers 18b as the plurality of internal electrode layers 18. The plurality of first internal electrode layers 18a and the plurality of second internal electrode layers 18b are buried so as to be alternately disposed at regular intervals along the stacking direction x of the laminate 14.

The respective electrode surfaces of the first internal electrode layer 18a and the second internal electrode layer 18b are perpendicular or substantially perpendicular to the direction in which the first metal terminal 40a and the second metal terminal 40b extend, and are parallel or substantially parallel to the mounting surface.

On one end side of the first internal electrode layer 18a, a first extended electrode portion 20a is led out to the first end surface 14e of the laminate 14. On one end side of the second internal electrode layer 18b, a second extended electrode portion 20b is led out to the second end surface 14f of the laminate 14. Specifically, the first extended electrode portion 20a on one end side of the first internal electrode layer 18a is exposed on the first end surface 14e of the laminate 14. The second extended electrode portion 20b on one end side of the second internal electrode layer 18b is exposed on the second end surface 14f of the laminate 14.

The internal electrode layer 18 may be parallel or substantially parallel, or perpendicular or substantially perpendicular to the mounting surface.

The laminate 14 includes a counter electrode portion 22a in which the first internal electrode layer 18a and the second internal electrode layer 18b face each other in the inner layer portion 16b of the ceramic layer 16. The laminate 14 further includes a side portion (hereinafter referred to as a "W gap") 22b of the laminate 14, which is provided between one end of the counter electrode portion 22a in the width direction y and the first side surface 14c and between the other end of the counter electrode portion 22a in the width direction y and the second side surface 14d. The laminate 14 furthermore includes an end portion (hereinafter referred to as an "L gap") 22c of the laminate 14, which is provided between an end portion on the side opposite to the first extended electrode portion 20a of the first internal electrode layer 18a and the second end surface 14f and between an end portion on the side opposite to the second extended electrode portion 20b of the second internal electrode layer 18b and the first end surface 14e.

The internal electrode layer 18 preferably includes, for example, metal such as Ni, Cu, Ag, Pd, and Au or an alloy including one of those metals, for example an Ag—Pd alloy. The internal electrode layer 18 may further include dielectric grains having the same or substantially the same composition as ceramics included in the ceramic layer 16.

The thickness of the internal electrode layer 18 is preferably not less than about 0.2 μm and not more than about 2.0 μm, for example.

An external electrode 24 is disposed on the first end surface 14e side and the second end surface 14f side of the laminate 14. The external electrode 24 includes a first external electrode 24a and a second external electrode 24b.

The first external electrode 24a is disposed on the first end surface 14e of the laminate 14 and extends from the first end surface 14e and partially covers the first main surface 14a, the second main surface 14b, the first side surface 14c, and the second side surface 14d. In this case, the first external electrode 24a is electrically connected to the first extended electrode portion 20a of the first internal electrode layer 18a. However, the first external electrode 24a may be disposed only on the surface of the first end surface 14e of the laminate 14.

The second external electrode 24b is disposed on the second end surface 14f of the laminate 14 and extends from the second end surface 14f and partially cover the first main surface 14a, the second main surface 14b, the first side surface 14c, and the second side surface 14d. In this case, the second external electrode 24b is electrically connected to the second extended electrode portion 20b of the second internal electrode layer 18b. However, the second external electrode 24a may be disposed only on the surface of the second end surface 14f of the laminate 14.

In the laminate 14, the first internal electrode layer 18a and the second internal electrode layer 18b face each other with the ceramic layer 16 interposed therebetween at each of the counter electrode portions 22a to provide an electrostatic capacitance. Thus, an electrostatic capacitance is obtained between the first external electrode 24a to which the first internal electrode layer 18a is connected and the second external electrode 24b to which the second internal electrode layer 18b is connected. Accordingly, the electronic component body having such a structure defines and functions as a capacitor element.

As shown in FIGS. 2 and 3, the first external electrode 24a includes, in order from the laminate 14 side, a first underlying electrode layer 28a and a first plating layer 30a disposed on the surface of the first underlying electrode layer 28a. Similarly, the second external electrode 24b has, in order from the laminate 14 side, a second underlying electrode layer 28b and a second plating layer 30b disposed on the surface of the second underlying electrode layer 28b.

The first underlying electrode layer 28a is disposed on the first end surface 14e of the laminate 14 and extends from the first end surface 14e and partially cover the first main surface 14a, the second main surface 14b, the first side surface 14c, and the second side surface 14d. However, the first underlying electrode layer 28a may be disposed only on the surface of the first end surface 14e of the laminate 14.

The second underlying electrode layer 28b is disposed on the second end surface 14f of the laminate 14 and extends from the second end surface 14f and partially covers the first main surface 14a, the second main surface 14b, the first side surface 14c, and the second side surface 14d. However, the second underlying electrode layer 28b may be disposed only on the surface of the second end surface 14f of the laminate 14.

Although the first underlying electrode layer 28a and the second underlying electrode layer 28b (hereinafter also simply referred to as the underlying electrode layer) each include at least one selected from a baking layer, a thin film layer and other suitable layers, in this preferred embodiment, the first underlying electrode layer 28a and the second underlying electrode layer 28b defined by the baking layer will be described.

The baking layer preferably includes glass and metal. As the metal of the baking layer, the baking layer preferably includes, for example, at least one selected from Cu, Ni, Ag, Pd, Ag—Pd alloy, Au and other suitable materials. As the glass of the baking layer, the baking layer preferably includes, for example, at least one selected from Si, Pd, Li, Na, K and other suitable materials. The baking layer may include a plurality of layers. The baking layer is formed by applying a conductive paste including glass and metal onto the laminate 14 and baking the conductive paste, and the baking layer may be formed by being fired simultaneously with the ceramic layer 16 and the internal electrode layer 18 or may be formed by being baked after the ceramic layer 16 and the internal electrode layer 18 are fired. The thickness of the thickest portion of the baking layer is preferably not less than about 10 µm and not more than about 200 µm, for example.

A resin layer including conductive grains and a thermosetting resin may be provided on the surface of the baking layer. The resin layer may be directly formed on the laminate 14 without forming the baking layer. The resin layer may include a plurality of layers. The thickness of the thickest portion of the resin layer is preferably not less than about 20 µm and not more than about 150 µm, for example.

The thin film layer is formed by a thin film forming method, such as a sputtering method or a vapor deposition method, for example, and is a layer of not more than about 1 µm, for example, in which metal grains are deposited.

The first plating layer 30a covers the first underlying electrode layer 28a. Specifically, the first plating layer 30a is preferably disposed on the first end surface 14e at the surface of the first underlying electrode layer 28a and extends to the first and second main surfaces 14a and 14b and the first and second side surfaces 14c and 14d at the surface of the first underlying electrode layer 28a. When the first underlying electrode layer 28a is disposed only on the surface of the first end surface 14e of the laminate 14, it is sufficient that the first plating layer 30a covers only the surface of the first underlying electrode layer 28a.

Similarly, the second plating layer 30b covers the second underlying electrode layer 28b.

Specifically, the second plating layer 30b is preferably disposed on the second end surface 14f at the surface of the second underlying electrode layer 28b and extends to the first and second main surfaces 14a and 14b and the first and second side surfaces 14c and 14d at the surface of the second underlying electrode layer 28b. When the second underlying electrode layer 28b is disposed only on the surface of the second end surface 14f of the laminate 14, it is sufficient that the second plating layer 30b is provided to cover only the surface of the second underlying electrode layer 28b.

As the first plating layer 30a and the second plating layer 30b (hereinafter also simply referred to as the plating layer), for example, at least one metal selected from Cu, Ni, Sn, Ag, Pd, Ag—Pd alloy, Au and the like or an alloy including the selected metals is preferably used.

The plating layer may include a plurality of layers. In this case, it is preferable that the plating layer have a two-layer structure including a nickel plating layer and a tin plating layer. By providing the nickel plating layer to cover the surface of the underlying electrode layer, the underlying electrode layer is prevented from being eroded by a solder used to join the first metal terminal 40a and the second metal terminal 40b. In addition, by providing the tin plating layer on the surface of the nickel plating layer, when the multilayer ceramic capacitor is mounted, it is possible to improve wettability of a solder used to mount the multilayer ceramic capacitor, so that the multilayer ceramic capacitor is easily mounted.

The thickness per layer of the plating layers is preferably not less than about 1 µm and not more than about 20 µm, for example. Further, it is preferable that the plating layer does not include glass. Furthermore, it is preferable that a metal proportion per unit volume in the plating layer is not less than about 99% by volume, for example.

Next, the case in which the first underlying electrode layer 28a and the second underlying electrode layer 28b are defined by plating electrodes will be described. The first underlying electrode layer 28a is defined by a plating layer directly connected to the first internal electrode layer 18a. The first underlying electrode layer 28a is disposed directly on the first end surface 14e of the laminate 14 and extends from the first end surface 14e and partially cover the first main surface 14a, the second main surface 14b, the first side surface 14c, and the second side surface 14d.

In addition, the second underlying electrode layer 28b is defined by a plating layer directly connected to the second internal electrode layer 18b. The second underlying electrode layer 28b is disposed directly on the second end surface 14f of the laminate 14 and extends from the second end surface 14f and partially cover the first main surface 14a, the second main surface 14b, the first side surface 14c, and the second side surface 14d.

However, in order for the first underlying electrode layer 28a or the second underlying electrode layer 28b to be defined by the plating layer, a catalyst is provided on the laminate 14 as a pretreatment.

It is preferable that the first underlying electrode layer 28a defined by the plating layer be covered with the first plating layer 30a. Similarly, it is preferable that the second underlying electrode layer 28b defined by the plating layer be covered with the second plating layer 30b.

It is preferable that the first and second underlying electrode layers 28a and 28b and the first and second plating layers 30a and 30b include, for example, plating of a metal selected from Cu, Ni, Sn, Pb, Au, Ag, Pd, Bi, and Zn or an alloy including the selected metals.

For example, when Ni is used as the internal electrode layer 18, Cu having good joinability with Ni is preferably used as the first underlying electrode layer 28a and the second underlying electrode layer 28b.

As the first plating layer 30a and the second plating layer 30b, Sn or Au with good solder wettability is preferably used, for example. As the first underlying electrode layer 28a and the second underlying electrode layer 28b, Ni having solder barrier performance is preferably used, for example.

The first plating layer 30a and the second plating layer 30b are formed as required, the first external electrode 24a may be defined by only the first underlying electrode layer 28a, and the second external electrode 24b may be defined by only the second underlying electrode layer 28b. The first plating layer 30a and the second plating layer 30b may be provided as the outermost layers of the first external electrode 24a and the second external electrode 24b, and another plating layer may be provided on the first plating layer 30a or the second plating layer 30b.

The thickness per layer of the plating layers is preferably not less than about 1 µm and not more than about 15 µm, for example. Further, it is preferable that the plating layer does not include glass. Furthermore, it is preferable that a metal proportion per unit volume in the plating layer be not less than about 99% by volume, for example. The first and second underlying electrode layers 28a and 28b each defined by the plating layer and the first and second plating layers 30a and 30b are grain-grown along the thickness direction, and have a columnar shape.

The plating layer may be disposed directly on the surface of the laminate 14 without providing the first and second underlying electrode layers 28*a* and 28*b*. When the plating layer is disposed directly on the surface of the laminate 14, the plating layer preferably includes, for example, at least one metal selected from Cu, Ni, Sn, Pb, Au, Ag, Pd, Bi, Zn and the like or an alloy including the selected metals.

The metal terminal includes a first metal terminal 40*a* and a second metal terminal 40*b*.

The metal terminal is provided to mount the multilayer ceramic electronic component 10 on the mounting substrate.

As the first metal terminal 40*a*, a plate-shaped lead frame is preferably used, for example. The first metal terminal 40*a* defined by the plate-shaped lead frame includes one main surface connected to the first external electrode 24*a*, another main surface facing the one main surface, and a peripheral surface that defines a thickness between the one main surface and the other main surface. It is preferable that the first metal terminal 40*a* defined by the plate-shaped lead frame have an L-shaped cross-section.

Similarly, for the second metal terminal 40*b*, a plate-shaped lead frame is preferably used, for example. The second metal terminal 40*b* defined by the plate-shaped lead frame includes one main surface connected to the second external electrode 24*b*, another main surface facing the one main surface, and a peripheral surface that defines a thickness between the one main surface and the other main surface. It is preferable that the second metal terminal 40*b* defined by the plate-shaped lead frame have an L-shaped cross-section.

In the case in which the first metal terminal 40*a* and the second metal terminal 40*b* each have an L-shaped cross-section, when the multilayer ceramic electronic component 10 is mounted on the mounting substrate, resistance against deflection of the mounting substrate is improved.

The first metal terminal 40*a* is connected to the first external electrode 24*a* of the electronic component body 12 with the first joining material 60*a* interposed therebetween.

The second metal terminal 40*b* is connected to the second external electrode 24*b* of the electronic component body 12 with the second joining material 60*b* interposed therebetween.

The first metal terminal 40*a* includes a first terminal joining portion 42 connected to the first end surface 14*e* of the laminate 14, a first extending portion 44 connected to the first terminal joining portion 42 and extending toward the mounting surface such that a gap is provided between the second main surface 14*b* of the electronic component body 12 and the mounting surface, and a first mounting portion 46 connected to the first extending portion 44 and extending from the first extending portion 44 toward a direction connecting the first end surface 14*e* and the second end surface 14*f*.

The second metal terminal 40*b* includes a second terminal joining portion 52 connected to the second end surface 14*f* of the laminate 14, a second extending portion 54 connected to the second terminal joining portion 52 and extending toward the mounting surface such that a gap is provided between the second main surface 14*b* of the electronic component body 12 and the mounting surface, and a second mounting portion 56 connected to the second extending portion 54 and extending from the second extending portion 54 toward the direction connecting the first end surface 14*e* and the second end surface 14*f*.

The first terminal joining portion 42 of the first metal terminal 40*a* is a portion connected to the first external electrode 24*a* on the first end surface 14*e* side of the laminate 14 with the first joining material 60*a* interposed therebetween, and has a rectangular or substantially rectangular plate shape having a size equal or substantially equal to the size in the width direction y on the first end surface 14*e* side of the electronic component body 12. A notch or other structure may be provided in the first terminal joining portion 42 of the first metal terminal 40*a*.

The second terminal joining portion 52 of the second metal terminal 40*b* is a portion connected to the second external electrode 24*b* on the second end surface 14*f* side of the laminate 14 with the second joining material 60*b* interposed therebetween, and has a rectangular or substantially rectangular plate shape having a size equal or substantially equal to the size in the width direction y on the second end surface 14*f* side of the electronic component body 12. A notch or other structure may be provided in the second terminal joining portion 52 of the second metal terminal 40*b*.

In the first terminal joining portion 42 of the first metal terminal 40*a*, a rib portion facing the first side surface 14*c* of the electronic component body 12 may be provided, and in the first terminal joining portion 42 of the first metal terminal 40*a*, a rib portion facing the second side surface 14*d* of the electronic component body 12 may be provided.

In the second terminal joining portion 52 of the second metal terminal 40*b*, a rib portion facing the first side surface 14*c* of the electronic component body 12 may be provided, and in the second terminal joining portion 52 of the second metal terminal 40*b*, a rib portion facing the second side surface 14*d* of the electronic component body 12 may be provided.

Thus, by providing the rib portion, it is possible to improve rigidity of the first terminal joining portion 42 of the first metal terminal 40*a*, and similarly, it is possible to improve rigidity of the second terminal joining portion 52 of the second metal terminal 40*b*. For example, when a load is applied from the length direction z of the multilayer ceramic electronic component 10, deformation of each terminal joining portion is reduced or prevented.

In addition, it is possible to increase a joining area between the first external electrode 24*a* and the first terminal joining portion 42 of the first metal terminal 40*a*, and similarly, it is possible to increase a joining area between the second external electrode 24*b* and the second terminal joining portion 52 of the second metal terminal 40*b*, so that disconnection of joining is reduced or prevented.

One end side of the first extending portion 44 of the first metal terminal 40*a* is connected to the other end side of the first terminal joining portion 42 and is a portion extending toward the mounting surface to provide a gap between the second main surface 14*b* of the electronic component body 12 and the mounting surface of the mounting substrate. In other words, the first extending portion 44 of the first metal terminal 40*a* is provided to space the electronic component body 12 of the multilayer ceramic electronic component 10 away from the mounting substrate on which the multilayer ceramic electronic component 10 is mounted.

One end side of the second extending portion 54 of the second metal terminal 40*b* is connected to the other end side of the second terminal joining portion 52 and is a portion extending toward the mounting surface to provide a gap between the second main surface 14*b* of the electronic component body 12 and the mounting surface of the mounting substrate. In other words, the second extending portion 54 of the second metal terminal 40*b* is provided to space the electronic component body 12 of the multilayer ceramic electronic component 10 away from the mounting substrate on which the multilayer ceramic electronic component 10 is mounted.

By providing the first extending portion 44 of the first metal terminal 40a and the second extending portion 54 of the second metal terminal 40b, AC voltage is applied by elastic deformation of the first metal terminal 40a and the second metal terminal 40b, so that mechanical distortion occurring in the ceramic layer 16 is absorbed. The vibration is prevented from being transmitted to the mounting substrate with the external electrode 24 interposed therebetween, so that occurrence of noise is reduced or prevented.

The first extending portion 44 of the first metal terminal 40a has a rectangular or substantially rectangular plate shape, for example, extends from the other end side of the first terminal joining portion 42 toward the mounting surface in a height direction orthogonal or substantially orthogonal to the second main surface 14b of the laminate 14, and is disposed in a single plane with the first terminal joining portion 42. The size of the first extending portion 44 in the width direction y may be the same or substantially the same as the size of the terminal joining portion in the width direction y, or the size of the first extending portion 44 in the width direction y may be narrower or wider.

The second extending portion 54 of the second metal terminal 40b has a rectangular or substantially rectangular plate shape, for example, extends from the other end side of the second terminal joining portion 52 toward the mounting surface in the height direction orthogonal or substantially orthogonal to the second main surface 14b of the laminate 14, and is disposed in a single plane with the second terminal joining portion 52. The size of the second extending portion 54 in the width direction y may be the same or substantially the same as the size of the terminal joining portion in the width direction y, or the size of the second extending portion 54 in the width direction y may be narrower or wider.

One end side of the first mounting portion 46 of the first metal terminal 40a is connected to the other end side of the first extending portion 44 of the first metal terminal 40a, and the first mounting portion 46 extends from the first extending portion 44 in the direction connecting the first end surface 14e and the second end surface 14f on the side opposite to the electronic component body 12 side.

One end side of the second mounting portion 56 of the second metal terminal 40b is connected to the other end side of the second extending portion 54 of the second metal terminal 40b, and the second mounting portion 56 extends from the second extending portion 54 in the direction connecting the first end surface 14e and the second end surface 14f on the side opposite to the electronic component body 12 side.

Preferably, the first mounting portion 46 of the first metal terminal 40a extends in the length direction z parallel or substantially parallel to the second main surface 14b from the other end side of the first extending portion 44 of the first metal terminal 40a, and is bent to be perpendicular or substantially perpendicular to the first extending portion 44 of the first metal terminal 40a.

Preferably, the second mounting portion 56 of the second metal terminal 40b extends in the length direction z parallel or substantially parallel to the second main surface 14b from the other end side of the second extending portion 54 of the second metal terminal 40b, and is bent to be perpendicular or substantially perpendicular to the second extending portion 54 of the second metal terminal 40b.

In the present preferred embodiment, the first mounting portion 46 and the second mounting portion 56 extend on the side opposite to the electronic component body 12, but conversely may extend toward the electronic component body 12. However, when the first and second mounting portions 46 and 56 extend on the side opposite to the electronic component body 12 side, it is preferable because mounting by welding to the mounting substrate is able to be easily performed.

The length of the first mounting portion 46 of the first metal terminal 40a in the length direction z (the direction connecting the both end surfaces of the laminate) may be longer than the length of the first extending portion 44 of the first metal terminal 40a in the stacking direction x (the direction connecting the two main surfaces of the laminate). The corner portion at which the first extending portion 44 of the first metal terminal 40a and the first mounting portion 46 of the first metal terminal 40a intersect may be rounded.

The length of the second mounting portion 56 of the second metal terminal 40b in the length direction z (the direction connecting the both end surfaces of the laminate) may be longer than the length of the second extending portion 54 of the second metal terminal 40b in the stacking direction x (the direction connecting the two main surfaces of the laminate). The corner portion at which the second extending portion 54 of the second metal terminal 40b and the second mounting portion 56 of the second metal terminal 40b intersect may be rounded.

The shape of the first mounting portion 46 is rectangular or substantially rectangular in plan view, and on one end side of the first mounting portion 46 in a direction connecting the first side surface 14c and the second side surface 14d, a first protrusion 48a that is sufficiently pressed and crushed into a circular or substantially circular shape and protruding toward the mounting surface of the mounting substrate is provided. On the other end side of the first mounting portion 46, a second protrusion 50a that is sufficiently pressed and crushed into a circular or substantially circular shape and protruding toward the mounting surface of the mounting substrate is provided. A recess on the side opposite to the mounting surface side of the mounting substrate in the first protrusion 48a is defined as a first recess 48b. A recess on the side opposite to the mounting surface side of the mounting substrate in the second protrusion 50a is defined as a second recess 50b.

The shape of the second mounting portion 56 is rectangular or substantially rectangular in plan view. The second mounting portion 56 is provided with a third protrusion 58a that is sufficiently pressed and crushed into a circular or substantially circular shape and protrudes toward the mounting surface of the mounting substrate. It is preferable that the third protrusion 58a be provided in a central portion of the second mounting portion 56. A recess on the side opposite to the mounting surface side of the mounting substrate in the third protrusion 58a is defined as a third recess 58b.

The respective apexes of the first protrusion 48a, the second protrusion 50a, and the third protrusion 58a protruding toward the mounting surface of the mounting substrate are structured to be in contact with the mounting surface of the mounting substrate. At this time, the first protrusion 48a, the second protrusion 50a, and the third protrusion 58a are not positioned on a straight line. According to the present preferred embodiment, with such a configuration, it is possible to provide a structure in which the protrusions are in point contact with the mounting surface of the mounting substrate at three positions or are in surface contact therewith with surfaces having small areas. Consequently, even if the mounting substrate warps, or a connection portion is not disposed in a single plane due to a step difference, it is possible to achieve a state in which the mounting surface reliably contacts at three positions, and to reliably perform mounting by welding.

Since a contact area between the mounting substrate and each of the first mounting portion 46 of the first metal terminal 40a and the second mounting portion 56 of the second metal terminal 40b is small, welding is able to be performed only by applying laser to the first recess 48b on the opposite side of the mounting surface of the mounting substrate in the first protrusion 48a, the second recess 50b on the opposite side of the mounting surface of the mounting substrate in the second protrusion 50a, and the third recess 58b on the opposite side of the mounting surface of the mounting substrate in the third protrusion 58a, and therefore, the welding time is shortened.

The first protrusion 48a, the second protrusion 50a, and the third protrusion 58a may be angular or may be rounded.

In the multilayer ceramic electronic component 10 according to the present preferred embodiment, a height h of the first, second, and third protrusions 48a, 50a, and 58a from bottom surfaces of the first and second mounting portions 46 and 56 is preferably not less than about 0.1 mm and not more than about 0.5 mm, for example. Alternatively, the height h of the first, second, and third protrusions 48a, 50a, and 58a is preferably not less than about 3% and not more than about 17%, for example, of an interval in the width direction y between the first protrusion 48a and the second protrusion 50a. Consequently, a distance between the first and second mounting portions 46 and 56 and the mounting surface of the mounting substrate is adequately ensured, and it is possible to efficiently absorb laser energy and to improve the advantageous effects of preferred embodiments of the present invention.

Preferably, for example, the interval in the width direction y between the first protrusion 48a and the second protrusion 50a is not less than about 40% with respect to a dimension (W dimension) in the width direction y of the multilayer ceramic electronic component 10, and the interval is not more than a length obtained by subtracting the size of the diameter of the first protrusion 48a or the second protrusion 50a from the size in the width direction y of the first mounting portion 46.

Preferably, the first protrusion 48a or the second protrusion 50a is located, for example, at a position spaced apart by not less than about 35% from the center of gravity in the first main surface 14a or the second main surface 14b of the laminate 14 with respect to a dimension (L dimension) in the length direction z of the electronic component body 12. In the length direction z on the second end surface 14f side with respect to the center of gravity, the third protrusion 58a is preferably located, for example, at a position of not less than about 35% with respect to the dimension (L dimension) in the length direction z of the electronic component body 12, and the position in the width direction y in the second mounting portion 56 is between the first protrusion 48a and the second protrusion 50a along the width direction y.

It is preferable that the surfaces of the first and second metal terminals 40a and 40b be subjected to black paint or oxidation treatment. Consequently, absorption efficiency of laser energy is increased, and laser welding is easily performed in a short time.

A notch, a hole, or other suitable structure may be provided in the first terminal joining portion 42 and the second terminal joining portion 52. When a notch is provided, at a central portion in the width direction y of the first terminal joining portion 42 and the second terminal joining portion 56, the notch has a predetermined width in a height direction from each upper end side of the first terminal joining portion 42 and the second terminal joining portion 56. When a hole is provided, the hole is located at or substantially at a central portion of the first terminal joining portion 42 and the second terminal joining portion 56.

The first metal terminal 40a and the second metal terminal 40b each include a terminal body and a plating film provided on a surface of the terminal body.

The terminal body is preferably made of, for example, Ni, Fe, Cu, Ag, Cr, or an alloy primarily including one or more of these metals. The terminal body is more preferably made of, for example, Ni, Fe, Cu, Cr, or an alloy primarily including one or more of these metals. Specifically, for example, the metal of the parent material of the terminal body may be Fe-42 Ni alloy, SUS, Fe-18 Cr alloy, or Cu-8 Sn alloy. The thickness of the terminal body of the first metal terminal 40a and the second metal terminal 40b is preferably about not less than about 0.05 mm and not more than about 0.5 mm, for example.

The plating film includes, for example, a lower layer plating film and an upper layer plating film.

The lower layer plating film is provided on the surface of the terminal body, and the upper layer plating film is provided on a surface of the lower layer plating film. Each of the lower layer plating film and the upper layer plating film may include a plurality of plating layers.

At least a peripheral surface 49 of the first extending portion 44 and the first mounting portion 46 of the first metal terminal 40a, and a peripheral surface 51 of the second extending portion 54 and the second mounting portion 56 may not include a plating film. Consequently, when the multilayer ceramic electronic component 10 is mounted on the mounting substrate using solder, wetting up of the solder to the first metal terminal 40a and the second metal terminal 40b is reduced or prevented. Thus, it is possible to prevent the solder from wetting up between the electronic component body 12 and the first and second metal terminals 40a and 40b (floating portion), so that the floating portion is prevented from being filled with the solder. Thus, it is possible to sufficiently secure a space defining the floating portion. Accordingly, the first extending portion 44 of the first metal terminal 40a and the second extending portion 54 of the second metal terminal 40b are easily elastically deformed, so that mechanical distortion occurring in the ceramic layer 16 is able to be further absorbed by application of AC voltage. Consequently, it is possible to reduce or prevent transmission of vibration generated at this time to the mounting substrate with the external electrode 24 interposed therebetween. Accordingly, by providing the first metal terminal 40a and the second metal terminal 40b, it is possible to more stably reduce or prevent generation of acoustic noise (squeal). A plating film may not be provided on the entire or substantially the entire peripheral surface of each of the first metal terminal 40a and the second metal terminal 40b.

In the case of removing the plating film on the first extending portion 44 and the first mounting portion 46 of the first metal terminal 40a and the second extending portion 54 and the second mounting portion 56 of the second metal terminal 40b or the plating film on the entire or substantially the entire peripheral surfaces of the first metal terminal 40a and the second metal terminal 40b, the following methods may be used: a removal (cutting or polishing) method using a machine, a removal method using laser trimming, a removal method using a plating peeling agent (for example, sodium hydroxide), and a method of covering a portion with no plating with a resist film before forming the plating films of the first and second metal terminals 40a and 40b, and removing the resist film after forming the plating films of the first and second metal terminals 40a and 40b.

The lower layer plating film is preferably made of Ni, Fe, Cu, Ag, Cr, or an alloy primarily including one or more of these metals, for example. The lower layer plating film is more preferably made of Ni, Fe, Cr, or an alloy primarily including one or more of these metals, for example. When the lower layer plating film is made of Ni, Fe or Cr having a high melting point, or an alloy primarily including one or more of these metals, heat resistance of the external electrode 24 is improved. The thickness of the lower layer plating film is preferably not less than about 0.2 μm and not more than about 5.0 μm, for example.

The upper layer plating film is preferably made of Sn, Ag, Au, or an alloy primarily including one or more of these metals, for example. The upper layer plating film is more preferably made of Sn or an alloy primarily including Sn, for example. When the upper layer plating film is made of Sn or an alloy primarily including Sn, solderability between the first and second metal terminals 40a and 40b and the external electrode 24 is improved. The thickness of the upper layer plating film is preferably not less than about 1.0 μm and not more than about 20 μm, for example.

When each of the terminal body and the lower layer plating film is made of Ni, Fe or Cr having a high melting point, or an alloy primarily including one or more of these metals, heat resistance of the external electrode 24 is improved.

The first joining material 60a joins the first external electrode 24a and the first terminal joining portion 42 of the first metal terminal 40a. The first joining material 60a is disposed between the first terminal joining portion 42 of the first metal terminal 40a and the first external electrode 24a (the first external electrode 24a on the end surface 14e) facing the first terminal joining portion 42.

The second joining material 60b joins the second external electrode 24b and the second terminal joining portion 52 of the second metal terminal 40b. The second joining material 60b is disposed between the second terminal joining portion 52 of the second metal terminal 40b and the second external electrode 24b (the second external electrode 24b on the end surface 14f) facing the second terminal joining portion 52.

As the first and second joining materials 60a and 60b, solder, a conductive adhesive, or other suitable materials, for example, may preferably be used.

As the solder, for example, LF solder such as Sn—Sb type, Sn—Ag—Cu type, Sn—Cu type, or Sn—Bi type solder is preferably used. In the case of Sn—Sb type solder, the Sb content is preferably not less than about 5% and not more than about 15%, for example.

As the conductive adhesive, a bonding agent obtained by adding a metal filler of Ag or other suitable metal to a thermosetting resin, such as an epoxy resin, for example, is preferably used.

The dimension in the length direction z of the multilayer ceramic electronic component 10 is defined as the L dimension, the dimension in the stacking direction x of the multilayer ceramic electronic component 10 is defined as the T dimension, and the dimension in the width direction y of the multilayer ceramic electronic component 10 is defined as the W dimension.

As the dimensions of the multilayer ceramic electronic component 10, preferably the L dimension in the length direction z is not less than about 1.8 mm and not more than about 35.0 mm, the W dimension in the width direction y is not less than about 1.0 mm and not more than about 40.0 mm, and the T dimension in the stacking direction x is not less than about 0.6 mm and not more than about 4.0 mm, for example.

Next, the mounting structure of a multilayer ceramic electronic component 10 according to a preferred embodiment of the present invention will be described.

As shown in FIG. 7, the multilayer ceramic electronic component 10 is mounted on a mounting substrate 70. Specifically, the multilayer ceramic electronic component 10 is disposed on the mounting surface of the mounting substrate 70, and is joined to the mounting substrate 70 by welding in the first protrusion 48a and the second protrusion 50a of the first mounting portion 46 of the first metal terminal 40a and the third protrusion 58a of the second mounting portion 56 of the second metal terminal 40b.

In the joining by welding, it is preferable that the multilayer ceramic electronic component be joined by welding using laser L. That is, mounting by welding is performed while applying the laser L to the first recess 48b on the opposite side of the mounting surface of the mounting substrate 70 at the position of the first protrusion 48a, the second recess 50b on the opposite side of the mounting surface of the mounting substrate 70 at the position of the second protrusion 50a, and the third recess 58b on the opposite side of the mounting surface of the mounting substrate 70 at the position of the third protrusion 58a.

According to the multilayer ceramic electronic component 10 of the present preferred embodiment, since the first protrusion 48a and the second protrusion 50a of the first mounting portion 46 and the third protrusion 58a of the second mounting portion 56 are provided, it is possible to provide a configuration in which the protrusions are in point contact with the mounting surface of the mounting substrate 70 at three positions or are in surface contact therewith with surfaces having small areas. Consequently, even if the mounting substrate 70 warps, or a connection portion is not disposed in a single plane due to a step difference, it is possible to achieve a state in which the protrusions are reliably in contact with the mounting substrate 70 at three positions, and to reliably perform mounting by laser welding.

According to the mounting structure of the multilayer ceramic electronic component 10 of the present preferred embodiment, since the apexes of the first protrusion 48a and the second protrusion 50a of the first mounting portion 46 of the first metal terminal 40a and the third protrusion 58a of the second mounting portion 56 of the second metal terminal 40b are arranged to be in contact with the respective mounting surfaces of the mounting substrate 70, and mounting by welding can be performed while irradiating the laser L aiming at portions having small contact areas and small areas of the first recess 48b, the second recess 50b, and the third recess 58b, so that mounting by welding is able to be easily performed in a short time.

Next, a preferred embodiment of the method of manufacturing the multilayer ceramic electronic component having the configurations described above will be described with reference to the multilayer ceramic electronic component 10 as an example.

First, a ceramic green sheet, a conductive paste for internal electrodes for forming the internal electrode layer 18, and a conductive paste for external electrodes for forming the external electrode 24 are prepared.

Although the ceramic green sheet, the conductive paste for internal electrodes, and the conductive paste for external electrodes include an organic binder and a solvent, known organic binder and organic solvent may be used.

Then, the conductive paste for internal electrodes is printed on the ceramic green sheet in a predetermined pattern, for example, and an internal electrode pattern is formed on the ceramic green sheet.

The conductive paste for internal electrodes may be printed by a known method, such as screen printing or gravure printing, for example.

Then, a predetermined number of ceramic green sheets for outer layers on which the internal electrode pattern is not printed are stacked, ceramic green sheets on which the internal electrode pattern is printed are sequentially stacked thereon, and a predetermined number of the ceramic green sheets for outer layers are stacked thereon, thus producing a laminate sheet. Subsequently, this laminate sheet is pressure-bonded in the stacking direction x by, for example, isostatic pressing to produce a laminate block.

Thereafter, the laminate block is cut into a predetermined shape to cut out a raw laminate chip. At this time, corner portions or ridge portions of the raw laminate may be rounded by barrel polishing or other suitable method. Subsequently, the raw laminate chip that is cut out is fired to produce the laminate 14. Although a firing temperature of the raw laminate chip depends on a ceramic material or a material of the conductive paste for internal electrodes, the firing temperature is preferably not less than about 900° C. and not more than about 1300° C., for example.

Then, in order to form a baking layer of the external electrode 24, for example, the conductive paste for external electrodes is applied to an exposed portion of the first extended electrode portion 20a of the first internal electrode layer 18a exposed from the first end surface 14e in the surface of the laminate 14, and is baked, and similarly, in order to form the baking layer of the external electrode 24, for example, the conductive paste for external electrodes is applied to an exposed portion of the second extended electrode portion 20b of the second internal electrode layer 18b exposed from the second end surface 14f of the laminate 14, and is baked, thus forming the baking layer. The baking temperature at this time is preferably not less than about 700° C. and not more than about 900° C., for example. If necessary, one or more plating layers are formed on the surface of the baking layer, the external electrode 24 is formed, and the electronic component body 12 is manufactured.

Instead of forming a baking layer as the external electrode 24, plating treatment may be applied to a portion on the side of the first end surface 14e of the surface of the laminate 14, and a base plating film may be formed at an exposed portion of the first extended electrode portion 20a of the first internal electrode layer 18a exposed from the first end surface 14e. Similarly, plating treatment may be applied to a portion on the side of the second end surface 14f of the surface of the laminate 14, and a base plating film may be formed at an exposed portion of the second extended electrode portion 20b of the second internal electrode layer 18b exposed from the second end surface 14f.

Although either electrolytic plating or electroless plating may be used for the plating treatment, when electroless plating is used, a pretreatment using a catalyst is required so as to increase a plating deposition rate. Thus, there is a disadvantage that the process becomes complicated. Accordingly, it is preferable to use electrolytic plating. As the plating method, barrel plating is preferably used.

When a portion of the conductor of the external electrode 24 is formed on the surfaces of the first main surface 14a and the second main surface 14b of the laminate 14, a surface conductor pattern is previously printed on the outermost ceramic green sheet and then may be fired simultaneously with the laminate 14, or a surface conductor may be printed on the first main surface 14a and the second main surface 14b of the fired laminate 14 and then baked. If necessary, an upper plating layer is formed on the surface of the base plating film.

Thus, plating electrodes are formed directly on the first end surface 14e and the second end surface 14f of the laminate 14.

Subsequently, a process of attaching a metal terminal in the method of manufacturing the multilayer ceramic electronic component according to the present preferred embodiment will be described.

First, the first metal terminal 40a and the second metal terminal 40b are prepared.

Then, the first joining material (solder) 60a is applied to the surface of the first external electrode 24a of the first end surface 14e of the electronic component body 12 or the surface of the first terminal joining portion 42 of the prepared first metal terminal 40a. Thereafter, the first external electrode 24a of the electronic component body 12 and the first terminal joining portion 42 of the first metal terminal 40a are reflowed in a state of being joined, such that the first metal terminal 40a is attached to the first external electrode 24a of the electronic component body 12. Similarly, the second joining material (solder) 60b is applied to the surface of the second external electrode 24b of the second end surface 14f of the electronic component body 12 or the surface of the second terminal joining portion 52 of the prepared second metal terminal 40b. Thereafter, the second external electrode 24b of the electronic component body 12 and the second terminal joining portion 52 of the second metal terminal 40b are reflowed in a state of being joined, such that the second metal terminal 40b is attached to the second external electrode 24b of the electronic component body 12.

As described above, the multilayer ceramic electronic component 10 shown in FIG. 1 is manufactured.

The present invention is not limited to the above-described preferred embodiments, and may be modified in various ways without departing from the scope of the present invention. The thickness of the ceramic layer of the electronic component body, the number of layers, the counter electrode area, and the external dimensions are not limited to the examples described above. In the electronic component body 12, the first internal electrode layer 18a and the second internal electrode layer 18b may be arranged parallel or substantially parallel, or perpendicular or substantially perpendicular to the mounting surface.

In the multilayer ceramic electronic component 10 according to the above-described preferred embodiment, only one electronic component body 12 is included, but the present invention is not limited thereto. The electronic component bodies 12 may be stacked in two or more stages, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A multilayer ceramic electronic component comprising:
a laminate including a plurality of ceramic layers and a plurality of internal electrode layers, which are alternately stacked, a first main surface and a second main surface facing each other in a stacking direction, a first side surface and a second side surface facing each other in a width direction orthogonal or substantially orthogonal to the stacking direction, and a first end surface and a second end surface facing each other in a length direction orthogonal or substantially orthogonal to the stacking direction and the width direction;

an electronic component body including a first external electrode connected to the first end surface of the laminate and a second external electrode connected to the second end surface of the laminate;

a first metal terminal connected to the first external electrode; and a second metal terminal connected to the second external electrode; wherein the second main surface of the laminate is located on a side of a mounting surface of a mounting substrate on which the multilayer ceramic electronic component is to be mounted;

the first metal terminal includes:
- a first terminal joining portion connected to the first end surface;
- a first extending portion which is connected to the first terminal joining portion and extends in a direction of the mounting surface such that a gap is provided between the second main surface of the electronic component body and the mounting surface of the mounting substrate; and
- a first mounting portion which is connected to the first extending portion and extends to a side opposite to an electronic component body side;

the second metal terminal includes:
- a second terminal joining portion connected to the second end surface;
- a second extending portion which is connected to the second terminal joining portion and extends in the direction of the mounting surface such that a gap is provided between the second main surface of the electronic component body and the mounting surface of the mounting substrate; and
- a second mounting portion which is connected to the second extending portion and extends to the side opposite to the electronic component body side;

the first mounting portion includes a first protrusion and a second protrusion protruding toward the mounting surface disposed on both end sides of the first mounting portion located in a direction connecting the first and second side surfaces;

the second mounting portion includes a third protrusion protruding toward the mounting surface; and apexes of the first, second, and third protrusions are in contact with the mounting surface.

2. The multilayer ceramic electronic component according to claim 1, wherein the first protrusion, the second protrusion, and the third protrusion are not positioned on a straight line.

3. The multilayer ceramic electronic component according to claim 1, wherein a height of the first and second protrusions from the mounting surface side of the first mounting portion is not less than about 0.1 mm and not more than about 0.5 mm.

4. The multilayer ceramic electronic component according to claim 1, wherein the height of the first and second protrusions from the mounting surface side of the first mounting portion is not less than about 3% and not more than about 17% of an interval between the first protrusion and the second protrusion.

5. The multilayer ceramic electronic component according to claim 1, wherein the first and second mounting portions are bent to the side opposite to the electronic component body.

6. The multilayer ceramic electronic component according to claim 1, wherein surfaces of the first and second metal terminals are made of a black painted material or an oxidation-treated material.

7. The multilayer ceramic electronic component according to claim 1, wherein the plurality of ceramic layers are made of a dielectric ceramic including at least one of $BaTiO_3$, $CaTiO_3$, $SrTiO_3$, and $CaZrO_3$.

8. The multilayer ceramic electronic component according to claim 1, wherein a thickness of each of the plurality of ceramic layers is not less than about 0.5 μm and not more than about 80 μm.

9. The multilayer ceramic electronic component according to claim 1, wherein the plurality of internal electrode layers are made of at least one of Ni, Cu, Ag, Pd, and Au or an alloy including at least one of Ni, Cu, Ag, Pd, and Au.

10. A mounting structure of a multilayer ceramic electronic component comprising:

a laminate including a plurality of ceramic layers and a plurality of internal electrode layers, which are alternately stacked, a first main surface and a second main surface facing each other in a stacking direction, a first side surface and a second side surface facing each other in a width direction orthogonal or substantially orthogonal to the stacking direction, and a first end surface and a second end surface facing each other in a length direction orthogonal or substantially orthogonal to the stacking direction and the width direction;

an electronic component body including a first external electrode connected to the first end surface of the laminate and a second external electrode connected to the second end surface of the laminate;

a first metal terminal connected to the first external electrode; and a second metal terminal connected to the second external electrode; wherein the second main surface of the laminate is located on a side of a mounting surface of a mounting substrate on which the multilayer ceramic electronic component is to be mounted;

the first metal terminal includes:
- a first terminal joining portion connected to the first end surface;
- a first extending portion which is connected to the first terminal joining portion and extends toward the mounting surface such that a gap is provided between the second main surface of the electronic component body and the mounting surface of the mounting substrate; and
- a first mounting portion which is connected to the first extending portion and extends to a side opposite to an electronic component body side;

the second metal terminal includes:
- a second terminal joining portion connected to the second end surface;
- a second extending portion which is connected to the second terminal joining portion and extends in the direction of the mounting surface such that a gap is provided between the second main surface of the electronic component body and the mounting surface of the mounting substrate; and a second mounting portion which is connected to the second extending portion and extends to the side opposite to the electronic component body side;

the first mounting portion includes a first protrusion and a second protrusion protruding toward the mounting surface disposed on the both end sides of the first mounting portion located in a direction connecting the first and second side surfaces;

the second mounting portion includes a third protrusion protruding toward the mounting surface;

apexes of the first, second, and third protrusions are joined to the mounting surface of the mounting substrate; and the multilayer ceramic electronic component is joined to the mounting surface of the mounting substrate by welding from a first recess on an opposite side to the mounting surface of the mounting substrate at the position of the first protrusion, joined to the mounting surface of the mounting substrate by welding from a second recess on the opposite side to the mounting surface of the mounting substrate at the position of the second protrusion, and joined to the mounting surface of the mounting substrate by welding from a third recess on the opposite side to the mounting surface of the mounting substrate at the position of the third protrusion.

11. The mounting structure of the multilayer ceramic electronic component according to claim 10, wherein during the joining by welding, the first, second, and third recesses are irradiated with laser, and the multilayer ceramic electronic component is joined by laser welding.

12. The mounting structure of the multilayer ceramic electronic component according to claim 10, wherein the first protrusion, the second protrusion, and the third protrusion are not positioned on a straight line.

13. The mounting structure of the multilayer ceramic electronic component according to claim 10, wherein a height of the first and second protrusions from the mounting surface side of the first mounting portion is not less than about 0.1 mm and not more than about 0.5 mm.

14. The mounting structure of the multilayer ceramic electronic component according to claim 10, wherein the height of the first and second protrusions from the mounting surface side of the first mounting portion is not less than about 3% and not more than about 17% of an interval between the first protrusion and the second protrusion.

15. The mounting structure of the multilayer ceramic electronic component according to claim 10, wherein the first and second mounting portions are bent to the side opposite to the electronic component body.

16. The mounting structure of the multilayer ceramic electronic component according to claim 10, wherein surfaces of the first and second metal terminals are made of a black painted material or an oxidation-treated material.

17. The mounting structure of the multilayer ceramic electronic component according to claim 10, wherein the plurality of ceramic layers are made of a dielectric ceramic including at least one of $BaTiO_3$, $CaTiO_3$, $SrTiO_3$, and $CaZrO_3$.

18. The mounting structure of the multilayer ceramic electronic component according to claim 10, wherein a thickness of each of the plurality of ceramic layers is not less than about 0.5 μm and not more than about 80 μm.

19. The mounting structure of the multilayer ceramic electronic component according to claim 10, wherein the plurality of internal electrode layers are made of at least one of Ni, Cu, Ag, Pd, and Au or an alloy including at least one of Ni, Cu, Ag, Pd, and Au.

* * * * *